(12) United States Patent
Beard et al.

(10) Patent No.: US 7,502,969 B2
(45) Date of Patent: Mar. 10, 2009

(54) METHOD AND APPARATUS FOR ANALYZING DIGITAL CIRCUITS

(75) Inventors: Douglas Richard Beard, Dresden (DE); Holger Eisenreich, Dresden (DE); Kai Eichhorn, Callenberg (DE)

(73) Assignee: Advanced Micro Devices, Inc., Austin, TX (US)

( * ) Notice: Subject to any disclaimer, the term of this patent is extended or adjusted under 35 U.S.C. 154(b) by 612 days.

(21) Appl. No.: 10/858,601

(22) Filed: Jun. 1, 2004

(65) Prior Publication Data

US 2005/0081113 A1    Apr. 14, 2005

(30) Foreign Application Priority Data

Sep. 29, 2003   (DE)   ................. 103 45 150

(51) Int. Cl.
*G06F 11/00* (2006.01)
(52) U.S. Cl. .............................. 714/39; 714/25; 714/28; 714/37
(58) Field of Classification Search .................. 714/25, 714/28, 33, 34, 37, 39, 45
See application file for complete search history.

(56) References Cited

U.S. PATENT DOCUMENTS

| 5,892,897 | A | * | 4/1999 | Carlson et al. ................ 714/37 |
| 5,923,567 | A | | 7/1999 | Simunic et al. ............. 364/490 |
| 6,230,114 | B1 | * | 5/2001 | Hellestrand et al. ........... 714/28 |
| 6,336,088 | B1 | | 1/2002 | Bauman et al. ................ 703/15 |
| 6,557,147 | B1 | * | 4/2003 | Lee et al. ........................ 716/4 |
| 6,904,576 | B2 | * | 6/2005 | Ng et al. ........................ 716/4 |
| 7,058,855 | B2 | * | 6/2006 | Rohfleisch et al. ............ 714/28 |
| 2005/0125754 | A1 | * | 6/2005 | Schubert et al. ............... 714/30 |

* cited by examiner

*Primary Examiner*—Robert Beausoliel
*Assistant Examiner*—Joseph D Manoskey
(74) *Attorney, Agent, or Firm*—Williams, Morgan & Amerson

(57) ABSTRACT

By providing at least two hardware representations of a specified circuit design, an efficient debugging system is provided that allows 100% design visibility at an extremely reduced simulation time owing to a time-shifted operation of the at least two hardware representations. Upon detection of a specified abort state in the leading hardware representation, the corresponding delayed state of the time-shifted hardware representation may be used for a subsequent simulation of only a relevant portion of the test run that has lead to the specified abort state.

17 Claims, 3 Drawing Sheets

METHOD AND APPARATUS FOR ANALYZING DIGITAL CIRCUITS

BACKGROUND OF THE INVENTION

1. Field of the Invention

The present invention relates to the field of analyzing the operational behavior of digital circuits at least partially in real time or approximately in real time by using a hardware implementation of the circuit design, such as a semiconductor chip including the circuit design, a prototype version, a field programmable gate array, and the like.

2. Description of the Related Art

The manufacturing of new types of digital integrated circuits or integrated circuits including a digital circuit portion typically requires a thorough verification of the functionality of the circuit design prior to the actual mass production process. That is, the behavior of the circuit has to match the desired functionality for any specified operating conditions. Due to the immense costs of the fabrication process of only a few integrated circuits, the circuit verification is often performed prior to actually manufacturing prototype versions in silicon. One approach in this respect is the conversion of the digital circuit design into a corresponding design model to simulate the operation of the circuit by software. For moderately complex circuit designs, however, the simulation requires great efforts in terms of time and processor resources and may take several weeks to several months. Thus, the simulation time may contribute approximately 60-80% to the total development time of a project. Consequently, the software simulation of the digital circuit design, although providing 100% design visibility, i.e., offering the potential for observing the complete status of the circuit at any time, is a less attractive approach in view of the extended time period from designing to actually producing a specified digital circuit design.

For this reason, attempts have been made to accelerate the circuit verification phase by providing hardware components representing the circuit design or portions thereof in combination with a software simulation, wherein an increased amount of hardware used in a DUT (device under test) may significantly reduce the requirements with respect to the software resources for simulating the circuit design, thereby also, however, reducing the degree of design visibility. For instance, the circuit design under consideration may be implemented, entirely or in part, by programmable logic devices (PLDs), such as field-programmable gate arrays (FPGAs), which allow, depending on the capability of the PLD used, an operation of the DUT at the speed, or nearly at the design speed, for which the integrated circuit is intended to be operated after the production. A hardware representation of the circuit design or a portion thereof by means of a programmable logic device enables, contrary to manufacturing a test silicon chip, a fast implementation and opens the possibility for re-designs of the circuit design, if necessary, by correspondingly re-configuring the programmable logic device. Moreover, running the hardware representation in a target system provides enhanced design verification capabilities and also supports the software development for the target system, wherein a mutual adaptation of the software for the target system and the hardware representation may readily be achieved by appropriately re-programming the software and the programmable logic device. Despite these advantages, the substantially hardware-based circuit design verification comes along with an extremely reduced design visibility compared to the software simulation of the circuit design, thereby also drastically reducing the debug capabilities, i.e., the capability of identifying and remedying errors in the circuit design.

While the software simulation, providing enhanced design visibility and thus debug capabilities, requires extended periods of simulating the circuit design under consideration, the hardware or prototype based verification, providing enhanced operation speed of the DUT and thus a high degree of similarity to actual operating conditions in a target system, renders debugging, i.e., identifying the root cause of any invalid behavior, difficult.

In view of the above-explained situation, a need exists for an improved technique of verifying a digital circuit design in a timely and cost-efficient manner while still providing a high degree of design visibility during the test phase.

SUMMARY OF THE INVENTION

Generally, the present invention is directed to a technique that enables the analysis of a digital circuit design or one or more portions thereof with the potential of tracing the status of a DUT as provided by software simulation while simultaneously maintaining the advantages of operating the DUT at high speed that is similar to the operating speed encountered in actual operating conditions. According to one illustrative embodiment, this is achieved by operating at least two hardware representations, such as programmable logic devices offering flexibility in terms of read back capabilities, access to internal signals, e.g., after synchronizers in the case of asynchronous multi-clock designs, prototypes or actual silicon implementations, of a specified digital circuit design or a portion thereof in a time-shifted manner, wherein after detecting a predefined state of the leading hardware representation, a corresponding delayed state obtained from the delayed hardware representation may be used for the analysis of the circuit design on the basis of the delayed state of the second hardware representation. For instance, the initialization of a software simulation may be triggered upon encountering a specified condition of the leading hardware representation so as to analyze the circuit behavior, starting from the delayed state obtained from the delayed hardware representation, with respect to the specified condition, which may represent any circuit status of interest or an invalid or a non-specified design state.

According to a further illustrative embodiment, a method comprises operating a second hardware representation of a digital circuit design in a time-delayed manner with respect to a first hardware representation of the digital circuit design. Then, upon occurrence of a predetermined abort state in the first hardware representation, an operational behavior of the digital circuit design is analyzed on the basis of a state of the second hardware representation.

According to a further illustrative embodiment of the present invention, an apparatus for analyzing a digital circuit design comprises a first hardware representation of the digital circuit design and a second hardware representation of the digital circuit design. An interface is provided and is linked to the second hardware representation, wherein the interface is configured to receive status data of the second hardware representation. Moreover, the apparatus comprises a state monitor configured to identify a specified state of the first hardware representation.

According to still a further illustrative embodiment, a system for analyzing a digital circuit design comprises a first hardware representation of the digital circuit design and a second hardware representation of the digital circuit design. An input section is provided and configured to provide a specified set of input signals to the first hardware representation and to provide the specified set of input signals to the second hardware representation in a time-delayed manner. The system further comprises a simulator including a simulation model of the specified digital circuit design and a state monitor operatively connected to the first hardware representation and configured to identify a predefined state of the first hardware representation. Additionally, the system includes an interface connected between the second hardware representation and the simulator.

BRIEF DESCRIPTION OF THE DRAWINGS

The invention may be understood by reference to the following description taken in conjunction with the accompanying drawings, in which like reference numerals identify like elements, and in which:

FIG. 1b schematically shows a circuit diagram of an apparatus for analyzing a digital circuit design similar to that of FIG. 1a;

Figure 1A:
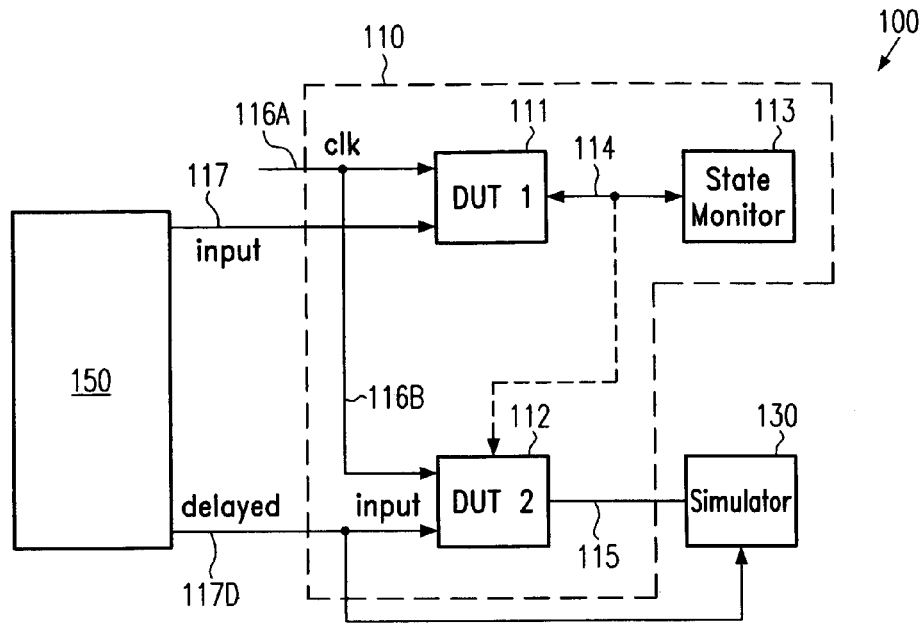
FIG. 1a schematically shows a circuit diagram of an apparatus for analyzing a digital circuit design according to one illustrative embodiment.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously explained, the present invention is based on the concept that at least two hardware representations, i.e., DUTs for a specified digital circuit design to be tested, may be provided and may be operated in a time-shifted manner such that the delayed DUT has "experienced" substantially the same "history," the development of which may then be analyzed by, for instance, simulation upon occurrence of a predefined event in the leading DUT. Thereby, the limited time difference between the specified state of the leading DUT and a corresponding delayed state of the delayed DUT significantly reduces the requirements on the simulator side in view of processor resources and simulation time. At the same time, during this limited simulation phase, a 100% design visibility is provided and enables a precise analysis of the behavior of the DUT and hence of the basic digital circuit design "in the vicinity" of a state of interest, such as an error state and the like. On the other hand, substantial test runs of the DUTs may be performed at a high speed, for example at approximately the intended operating speed or any other operating speed of interest, depending on the hardware resources and capabilities with which the DUTs are realized, so that the superior flexibility in testing digital circuit designs, as is provided by a rapid prototyping, is substantially maintained. In other embodiments, the second hardware representation may be operated in a step-by-step mode, by controlling the design clock signals, after the first hardware representation has reached the point of interest in real time. Thereby, the complete state of the second hardware representation, i.e., all synchronous storage elements, may be read out before the next step is performed, thereby providing 100% design visibility.

Full design visibility in the "vicinity" of a state of interest of the digital circuit design allows an effective analysis of the digital circuit, for instance in view of its interaction with its real time environment, e.g., for a goal-orientated debugging of the digital circuit as well as its environment, that is, hardware and software, or enables performance and hardware utilization analyses. This may accelerate the verification of the digital circuit by reducing the time effort for, e.g., simulations of the digital circuit, the software development, that is, hardware-software co-design, and the system integration of the digital circuit.

Moreover, usage of recorded input signals as stimuli for a simulator allows the reduction of the effort for developing a simulation environment including models of the system/test/target environment. If these models are needed anyway, the authentic real time data may be used to adjust these models to the real conditions.

With reference to FIGS. 1a-5, further illustrative embodiments will now be described in more detail. FIG. 1a schematically illustrates a system 100 for analyzing the behavior of a specified digital circuit design. It should be understood that the digital circuit design under consideration may include the design of a complete application specific integrated circuit (ASIC), a portion of interest of a digital circuit, the digital part or a portion thereof of a circuit design including analogous and digital sections, and the like. Hence, the term "digital circuit design" as used throughout the specification and the appended claims is to be understood in the above-defined sense unless otherwise explicitly specified in the description and the claims. The system 100 comprises an apparatus 110 including the hardware components required for operating at least two hardware representations of the digital circuit design of interest. The apparatus 110 may be coupled to an input section 150 and to an analyzing section, which is illustrated as a simulator 130. The apparatus 110 may comprise a first hardware representation 111 of the specified digital circuit design, which is also referred to as DUT1. Moreover, a second hardware representation 112 of the digital circuit design of interest, also referred to as DUT2, is provided in the apparatus 110, wherein the first and second hardware representations 111, 112 may be provided in the form of programmable logic devices, such as field-programmable gate arrays, which are appropriately programmed so as to represent the specified digital circuit design. Moreover, the first and second hardware representations 111, 112, when provided in the form of re-configurable gate arrays, may include any components as required for the proper operation of the apparatus 110. For instance, as shown in FIG. 1a, the apparatus 110 further comprises a state monitor 113 that is connected to the first hardware representation 111 by an interface 114. The state monitor 113 may be configured such that a state of the first hardware representation 111 may be monitored and compared with a reference state with a predefined "precision." That is, the state of the hardware representation 111 is represented by the state of each individual digital component, such as flip-flops, registers, internal memory sections, and the like. In assessing the behavior of the specified circuit design, it may not, however, be necessary to observe the state of each individual component in the first hardware representation 111 to define a corresponding abort condition that has to be identified by the state monitor 113. For instance, a specific combination of a plurality of flip-flop states may indicate a specific condition, such as an undesired operational behavior, of the first hardware representation 111 and thus of the specified digital circuit design, which may readily be identified by the state monitor 113 by comparing the present "state," that is, the digital code represented by the plurality of flip-flop states, with a predefined reference code. However, any other implementation of "hardware checkers," trigger or detection logic, a specific value on a certain signal, like "FIFO overrun," and the like, for the state monitor 113 may be used as long as it enables the identification of a specified behavior of the first hardware representation 111. The data communication between the first hardware representation 111 and the state monitor 113 may be accomplished by the interface 114. In one embodiment, the interface 114 may include a plurality of buffers connected to one or more digital components of the first hardware representation 111 that are relevant for assessing the state thereof. In other embodiments, the interface 114 may be configured so as to enable data communication between the state monitor 113 and the first and second hardware representations 111, 112, as indicated by the dashed line. For instance, a stop signal may be supplied to the first and second hardware representations 111, 112 via the interface 114 upon detection of a specified abort state, e.g., shut off of a clock gate. In other embodiments, the interface 114 may be configured so as to enable a bi-directional data communication between the state monitor 113 and the first and second hardware representations 111, 112 so as to generate a specified start condition in the first and second hardware representations 111, 112 by correspondingly setting the state of all internal logic components in the first and second hardware representation 111, 112. For instance, a reset signal may create the initial state or the first and second hardware representations 111, 112 may be preloaded with specific values. The interface 114 may be formed by hardware or by a mixture of hardware and software components, for instance provided in the form of an external controller unit (not shown), or by any other appropriate means that are well known in the art, such as a logic analyzer connected to the first hardware representation 111 in combination with a digital comparator. In one particular embodiment, the interface 114 may be formed by a programmable logic device, for example as an additional component of the first hardware representation 111. Similarly, in one embodiment, the state monitor 113 may be formed in combination with the interface 114 and the first hardware representation 111 as an integral part of the programmable logic device.

The apparatus 110 further comprises a second interface 115 that is connected to the second hardware representation 112, wherein the second interface 115 is configured such that the state of the second hardware representation 112 may be read out to an external source, such as a buffer, an analyzer and/or the simulator 130. It should be emphasized that any source for analyzing the read-out states of the second hardware representation 112, such as the simulator 130, may not need to be permanently connected to the interface 115. For instance, the states of the second hardware representation 112 may be buffered and transferred to an external source, such as the simulator 130, at any appropriate time.

Regarding the state of the second hardware representation 112, the same criteria apply as previously explained with reference to the first hardware representation 111. In one particular embodiment, the second interface 115 is configured to provide the complete state of the second hardware representation 112, that is, the state of all internal digital components, such as flip-flops, storage elements, and the like, may be read out via the second interface 115. In one illustrative embodiment, the second interface 115 may be implemented in the form of a programmable logic device. For instance, a field-programmable gate array may provide the ability to capture the state of all sequential components and may also include an on-chip standard interface, such as a JTAG interface, for providing the captured data to the periphery.

Depending on the hardware resources of the programmable logic device, in one embodiment, the apparatus 110 as a whole may be provided by correspondingly configuring the programmable logic device. Moreover, the first and second hardware representations 111, 112 are further configured to receive respective input signals from the input section 150 and to receive corresponding clock signals 116a and 116b, respectively, which are shown in FIG. 1a as being identical, which may in other embodiments differ from each other. For instance, the clock signal 116b may be provided as a gated version of the clock signal 116a so as to enable to stop the clock signal 116b for data capturing if needed. It should be appreciated that forming substantial parts of the apparatus 110 by a programmable logic device allows a rapid implementation and re-design of the specified digital circuit design under consideration. In other embodiments, however, it may be considered appropriate to provide silicon-based prototype versions or ASICs (application specific ICs) for the first and second hardware representations.

The operation of the system 100 is based on the concept that the first hardware representation 111 and the second hardware representation 112 are operated in a time-shifted manner. In this respect, the term "time-shifted" and the term "time-delayed" or simply "delayed" may be used interchangeably, and may be understood such that at least after a certain time period of operating the apparatus 110, the first hardware representation 111 has experienced a longer section of its "temporal evolution" compared to the second hardware representation 112. The temporal evolution, that is, the electrical behavior of a DUT, may depend on, in addition to the operating speed, i.e., the frequency of the clock signal and the input signals supplied thereto, the target system in which the DUT is to be implemented and on the environmental conditions under which the target system is to be operated. When the first and second hardware representations 111, 112 may be implemented in a form that provides a sufficient "similarity" with the semiconductor chips that are actually to be fabricated after a successful verification of the specified digital circuit design, the environmental conditions may be selected so as to substantially correspond to actual environmental conditions in the target application. In other embodiments, environmental conditions may not be of high relevance and therefore the hardware configuration of the first and second hardware representations 111, 112 may significantly differ from a semiconductor chip. In any case, the clock signals 116a and 116b and the input signals supplied by the input section 150 may be considered as the relevant criteria determining the temporal evolution, that is, the electrical behavior of the digital circuit design under consideration. Hence, the amount of time shift between the first hardware representation 111 and the second hardware representation 112 is determined by the clock signals 116a, 116b and the respective input signals, wherein the digital response of the first and second hardware representations 111, 112 with respect to the clock signals 116a, 116b and the respective input signals is substantially the same as long as any manufacturing tolerances of the first and second hardware representations 111, 112 may not be critical with respect to the respective high and low times of the corresponding clock signals 116a, 116b, and as long as asynchronous signals within a single hardware representation may not exist. A corresponding apparatus for dealing with two or more asynchronous portions in a single DUT is explained with reference to FIG. 4 in more detail.

As depicted in FIG. 1a, the delayed or time shifted operation of the first and second hardware representations 111, 112 may be achieved by supplying the clock signals 116a, 116b as substantially identical signals and by providing a set of input signals 117 to the first hardware representation 111 and providing the same set of input signals as delayed input signals 117d to the second hardware representation 112. While the state of the first hardware representation 111 changes in response to the input signal 117 and the clock signal 116a, the second hardware representation 112 responds to the clock signal 116b, which in this example is identical to the clock signal 116a and to the delayed input 117d, and therefore the operation, i.e., the succession of states of the second hardware representation 112, is delayed with respect to the succession of states of the first hardware representation 111. Upon occurrence of a predefined abort state detected by the state monitor 113 via the interface 114, the corresponding delayed state of the second hardware representation 112 may then be supplied to the simulator 130 via the second interface 115. Depending on the hardware resources of the second interface 115 and the second hardware representation 112, an interruption of the operation of the first and second hardware representations 111, 112 may be carried out so as to transfer the status data from the second hardware representation 112 to the simulator 130. As shown in FIG. 1a, the delayed input 117d is also supplied to the simulator 130 so that the simulator, including a model of the digital circuit design of interest, may be initiated with the delayed state of the second hardware representation 112 and may be stimulated by the delayed input signal 117d. Hence, starting from the delayed state of the second hardware representation 112, the evolution from this state to the predefined abort state may be "reconstructed" at 100% design visibility by means of the simulator 130.

Figure 2:
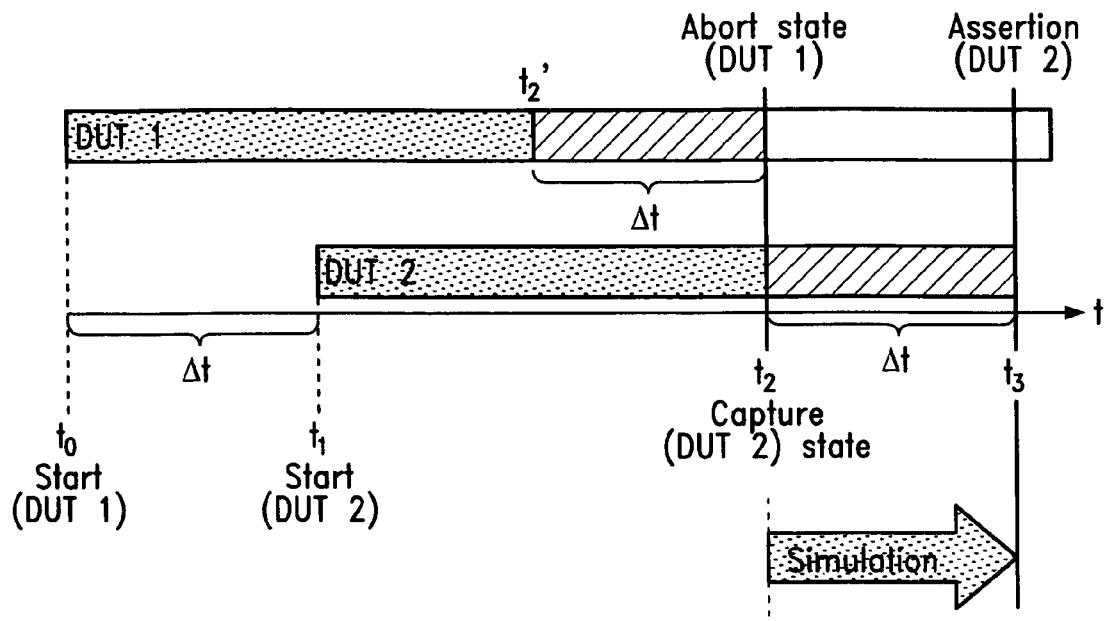
FIG. 2 schematically depicts a time flowchart representing the time-shifted operation of a first DUT and a second DUT according to the apparatus shown in FIGS. 1a and 1b.

FIG. 2 schematically illustrates a time chart representing the operation of the system 100. The horizontal axis represents the time, while the operation of the first and second hardware representations 111, 112 are shown as respective bars. At time $t_0$, the operation of the first hardware representation 111 is started by supplying the clock signal 116a and the input signal 117. After a time interval indicated by $\Delta t$, the operation of the second hardware representation 112 is started at time $t_1$ by providing the clock signal 116b and the delayed input signal 117d, wherein the length of the time interval $\Delta t$ is determined by the amount of time delay of the input signal 117d as provided by the input section 150. As previously described, the signal 116b may be a gated version of clock signal 116a. Furthermore, signal 116a may be identical to 116b and the second hardware representation 112 is held in reset state until the first delayed pattern is available on 117d. Moreover, the reset signal may also be delayed and be a part of the pattern. For instance, the input signals 117 and 117d may be provided as independent tables that are read out starting at $t_0$ for the input 117 and starting at time $t_1$ for the input 117d. In other embodiments, the input section 150 may comprise a shift register or a ring buffer, wherein the input signals 117 may be supplied directly to the first hardware representation 111, while the delayed input signals 117d are read out at an appropriate location of the shift register or ring buffer. At time $t_2$, an abort state is detected by the state monitor 113, which entails the capture of the corresponding state of the second hardware representation 112, which may be transferred to the simulator 130 via the interface 115, wherein, as previously explained, the read-out states may be buffered and transferred to the simulator 130 or any other analyzing source at any appropriate time. Preferably, the complete state of the second hardware representation 112 is read out and transferred to the simulator 130. Thus, the state of the second hardware representation 112 at time $t_2$ corresponds to the state of the first hardware representation 111 at time $t_2'$ so that the hatched area of the operation of the first hardware representation 111 may then be analyzed or reconstructed by simulation such that the state of the simulator 130 at time $t_3$ or any other state in the hatched area may be used to assert, verify or analyze the behavior of the specified digital circuit design. During the simulation phase, i.e., the interval $(t_2, t_3)$, 100% design visibility is obtained and enables one to precisely analyze the electrical behavior of the digital circuit design of interest. It should be noted that the time and the corresponding time interval $\Delta t$ in FIG. 2 is to be understood in terms of number of clock cycles rather than in terms of the physical time, since the simulation may typically be performed at a different speed than the actual operation of the first and second hardware representations 111, 112. In one particular embodiment, the state at time $t_3$ provided by the simulator 130 may be compared to the abort state of the first hardware representation 111 at time $t_2$ so as to verify the validity of the simulation model, adapt the simulation model upon detecting a difference and/or to detect timing issues of the specified digital circuit design under consideration by reading out states of the first hardware representation.

As previously explained, the simulation of a complex circuit design may require high efforts in terms of simulation resources and time and, hence, according to the present invention, the effort regarding the simulation may be adjusted by appropriately selecting the time interval $\Delta t$. For instance, the time interval $\Delta t$ may be selected to be moderately small, such as a few clock cycles, and may be correspondingly increased should the corresponding simulation phase reveal an insufficient "depth" for appropriately analyzing the circuit behavior, for instance for locating and remedying design errors.

Figure 1B:
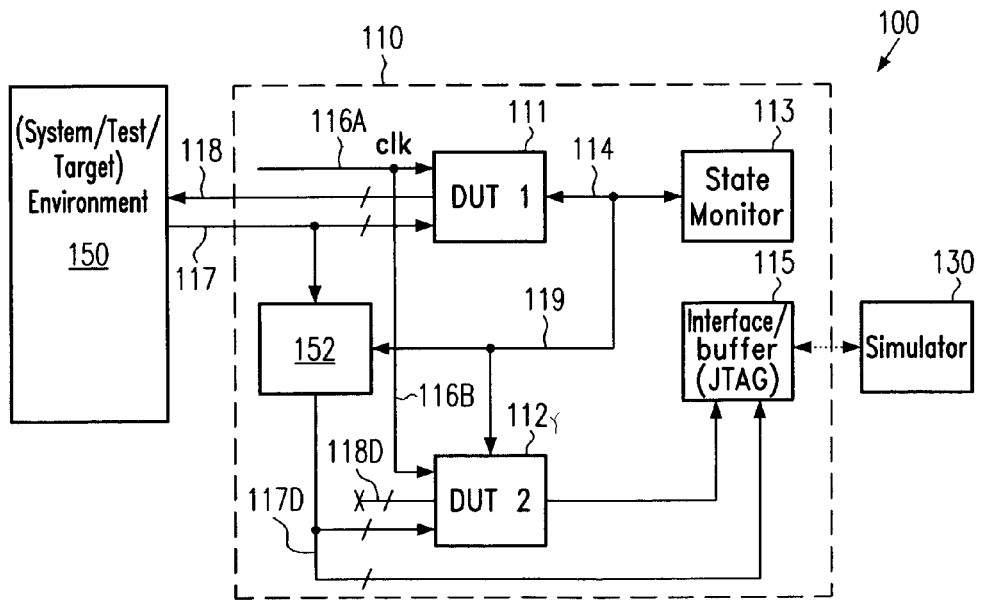

FIG. 1b schematically depicts a further illustrative embodiment, wherein the same reference numerals are used for components and parts that are similar or identical to those shown in FIG. 1a. The system 100 comprises the apparatus 110 including a buffer 152 that receives the input signals 117 and provides the delayed signals 117d. The input signals 117 are provided from the input section 150, which may represent a defined system, test or target environment for the circuit design under consideration so as to enable the test of the circuit design under any desired conditions. To this end, the input section 150 may be configured to receive output signals 118 from the first hardware representation 111, whereas corresponding outputs 118d of the second hardware representation 112 may not be connected, since the response or interaction of the input section 150 is "preserved" in the buffer 152 in the form of the temporarily stored input signals 117.

The apparatus 110 further comprises the interface 115, which may include a buffer for receiving the state and the delayed input signals 117d of the second hardware representation 112, which may, upon request, be transferred to an analyzing section, such as the simulator 130.

During the operation of the system 100 of FIG. 1b, the input section 150 provides the input signal 117, which may be determined by the interaction of the input section 150 with the output signals 118. Upon occurrence of an abort state detected by the state monitor 113, a corresponding stop signal 119 may be supplied to the buffer 152 and the second hardware representation 112. Based on the input history stored in the buffer 152 and the corresponding states of the second hardware representation 112 that are accessible via the interface/buffer 115, the analysis may be performed similarly as described with reference to FIGS. 1a and 2.

In the illustrative embodiments described with reference to FIGS. 1a, 1b and 2, the first and second hardware representations 111, 112 are operated at the same speed by providing the same clock signal to each of the hardware representations and by delaying the respective input signals. In other embodiments, it may be considered appropriate to run the first hardware representation 111 at a higher speed than the second hardware representation 112, wherein the respective input signals 117 and 117d are supplied in synchronism with the respective different clock signals 116a and 116b. For instance, the difference in speed of the two hardware representations may be varied or may be adapted to the sequence of input signals supplied to the hardware representations 111, 112, thereby also correspondingly adjusting the degree of time delay and hence of simulation depth. For example, a simple input pattern may only require a short time interval $\Delta t$, and hence a reduced simulation depth, and therefore the second hardware representation 112 may be operated by a clock signal 116b that is only significantly less than the clock signal 116a. During a sophisticated input pattern, it may be deemed appropriate to provide a moderately large simulation depth if a circuit analysis is required during this test phase, and hence the frequency of the clock signal 116b may correspondingly be decreased. In other embodiments, an increasing $\Delta t$, caused by a difference of the clock signal frequencies, may be compensated for during non-critical test run phases by adjusting the clock signal frequency 116b higher than that of the clock signal 116a, thereby reducing the amount of time delay between the first and the second hardware representations 111, 112 as long as the increase of clock signal frequency is compatible with static constraints of the second hardware representation 112. That is, the high and low times of the clock signal may be shortened only to the extent that intrinsic settling times and the like are compatible with the increased clock frequency for the clock signal 116b.

Regarding the detection of a specified abort state of the first hardware representation 111 and the subsequent simulation in the simulator 130 when the first and second hardware representations 111, 112 are operated at different speeds, the same criteria apply as previously explained with reference to a substantially constant operating speed of the first and second hardware representations 111, 112.

It should be noted that an increase of simulation depth during a test run of the system 100 may also be obtained with the embodiments described with reference to FIGS. 1a and 2, wherein the first and second hardware representations 111, 112 are operated at the same speed, by increasing the time delay of the input signal 117d. For instance, at a first phase of the operation of the system 100, a time delay of a few clock cycle periods may be deemed appropriate, whereas, in an advanced operating phase, an increased simulation depth may be considered convenient in case an abort state is detected.

A different speed of the clock signals may be advantageous if optimization techniques are applied to support an efficient implementation of the delay block, such as the buffer 152. In the case of using a memory, for instance, data compression may be applied on the memory input, decompression on the memory output. Furthermore a reference clock may be introduced for handling asynchronous multi-clock designs, as is described later on. This may also result in different clock speeds.

Figure 3:
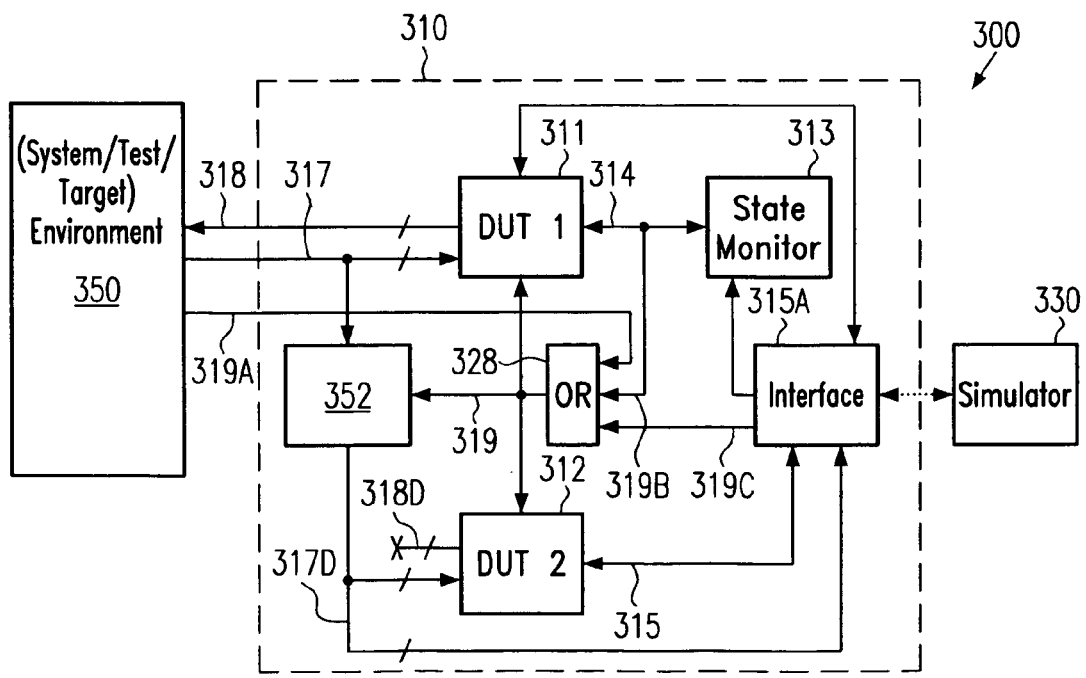
FIG. 3 schematically shows a block diagram of a further illustrative embodiment, wherein a buffer is used to delay the input signals supplied to one of two DUTs so as to provide for a time-shifted operation.

With reference to FIG. 3, further illustrative embodiments will now be described in more detail. In FIG. 3, a system 300 comprises an apparatus 310 including a first DUT 311 and a second DUT 312. The DUT 311 may comprise a hardware representation of a specified digital circuit design to be analyzed and further comprises a state monitor 313 that is configured to detect and indicate a specified state of the hardware representation. For instance, the state monitor 313 may be provided in the form of a hardware checker enabling the monitoring of the state of the hardware representation, or at least the monitoring of one or more specified hardware components within the DUT 311 by detecting the state of at least one signal. In other embodiments, the state monitor 313 may represent any type of logic analyzer that is capable of detecting a state, compare it to a specified state, and provide a corresponding signal. In one particular embodiment, the first DUT 311 is formed by a programmable logic device. The second DUT 312 also includes a hardware representation of the digital circuit design under consideration and may further include hardware components that enable the capture of status information of the second DUT 312. In one particular embodiment, the second DUT 312 comprises digital circuitry for capturing the state of substantially all sequential components representing the specified digital circuit design under consideration, such as flip-flop states, the contents of memory sections, and the like. The second DUT 312 including the capture circuitry may be provided in the form of an appropriately configured programmable logic device. The apparatus 310 further comprises a buffer 352 that is connected with its output side to the second DUT 312 so as to provide delayed input signals 317*d*, and is also connected via an appropriate interface 315, such as a JTAG interface, to an analyzing section, represented by a simulator 330. An input side of the buffer 352 is connected to an input section 350 to receive corresponding input signals 317 therefrom. The input section 350 may be configured in the form of a desired system, test, target environment and may be configured to receive output signals 318 from the first DUT 311. A digital circuit 328 representing a logic OR function is provided, the inputs of which may be connected to the state monitor 313, the input section 350, and an interface 315*a* providing a connection to the simulator 330. The output of the logic circuit 328 is connected to the first and second DUTs 311, 312 and the buffer 352 to provide a stop trigger signal for discontinuing the operation of these components.

During operation of the system 300, the state monitor 313 may be appropriately configured, for instance via the interface 315*a*. A clock signal source (not shown) may provide clock signals to the first and second DUTs 311, 312 and to the buffer 352 so as to insure synchronous operation of these components. The external input section 350 may apply a set of appropriate input signals, such as the input signals 317, and may receive the output signals 318 so as to enable a desired interaction with the system environment that may be established in said input section 350, wherein the input signals 317 stimulate an operation of the first DUT 311 in accordance with the basic digital circuit design, while the input signals 317 are temporarily stored in the buffer 352 synchronously with the operation of the first and second DUTs 311, 312. Depending on the buffer depth of the buffer 352, which may be provided in the form of a FIFO (first in first out) buffer, possibly in combination with an internal or external RAM storage element, the input signals 317 are supplied to the second DUT 312 in a time-delayed manner in the form of the signals 317*d*. Hence, the presently existing states of the first and second DUTs 311 and 312, that is, the states of the respective hardware representations of the specified digital circuit design under consideration, are spaced in time by a specified number of clock cycles corresponding to the effective depth of the buffer 352. Upon occurrence of a specified abort state detected by the state monitor 313, a corresponding stop signal 319*b* is generated and supplied to the OR logic 328 to supply the stop trigger signal 319 to the buffer 352 and the first and second DUTs 311, 312. Thus, the input "history" is stored in the buffer 352, whereas the corresponding state of the digital circuit design is preserved in the second DUT 312. The operation of the apparatus 310 may also be interrupted by corresponding stop signals 319*a* from the input section 350 and 319*c* from the interface 315*a* to provide for increased flexibility in operating the system 300. After discontinuing the operation of the buffer 352 and the second DUT 312, the status data obtained by the capture logic included in the second DUT 312 is provided to the simulator 330 via the interface 315 or any buffer (not shown) so as to initialize the simulator 330 at an appropriate time with the corresponding design state. Additionally, the delayed input signals 317*d* may also be provided to the simulator and may thus be used as stimuli for the simulation process. Thereafter, the digital circuit design under consideration may be analyzed in substantially the same manner as previously explained with reference to FIGS. 1*a* and 2. The interface 315*a* may be configured such that initial states of the first and second DUTs 311, 312 may be preloaded as is described with reference to FIG. 1*a*.

Consequently, an effective hardware debugging system is provided, wherein, in one particular embodiment, the apparatus 310 is provided in the form of an appropriately configured field-programmable gate array, wherein the complexity of the digital circuit design under consideration is restricted merely by the hardware resources of the field-programmable gate array. In other embodiments, any restrictions dictated by the hardware resources of a field-programmable gate array may be avoided by using one or more external components, such as memory elements, for the buffer 352, external elements for the state monitor 313, and external components for providing the logic circuitry for capturing the state of the second DUT 312. Therefore, the present invention should not be considered as being restricted to a specific hardware implementation of the apparatus 310 unless such restrictions are explicitly recited in the appended claims.

In the embodiments described with reference to FIGS. 1*a*-3, the specified digital circuit design to be analyzed is considered as representing a circuit or a circuit portion operated by a single clock signal. In complex digital circuits, however, two or more circuit portions may be provided that are operated with different clock signals, that is, with different speeds, wherein the different clock signals are generated in a substantially non-correlated manner. Hence, the clock signals of these different circuit portions typically do not have a fixed relationship of phase and frequency, and may therefore be referred to as asynchronous clock signals. In this respect, a specified circuit portion driven by a specified clock signal is referred to as a clock domain. Since two or more clock domains may operate in a substantially non-correlated manner, any interaction, i.e., a signal transfer, between clock domains are to be handled with care so as to guarantee a specified operational behavior of the total circuitry. For instance, signals may cross from one clock domain to another directly or over a corresponding synchronization logic. Any signals controlling the interaction between two different clock domains, such as hand shaking signals, and the like, have to be supplied via a synchronization logic so that these control signals may be considered as synchronized signals with respect to the target clock domain. These synchronized signals may usually then be used for indicating signals that cross directly, such as data signals, bus signals, and the like, as valid signals or not. Since any synchronization process occurring in a digital circuit design may take place in a different manner in a first and a second hardware representation or DUT of the digital circuit design owing to manufacturing process variations and differing run time conditions such as temperature, voltage, and the like, these synchronization processes may not necessarily happen in an identical way in the leading and the delayed DUT. For this reason, in one illustrative embodiment, the clock domains in the second DUT, i.e., in the delayed DUT, may be decoupled from each other by additionally storing any control signals and data signals of the first DUT, i.e., the leading DUT, which cross clock domains. Thereby, any control signals exchanged between clock domains in a synchronized manner may be sampled after passing a corresponding synchronization logic and may then be stored. In this way, the time-shifted operation of the second DUT is achieved in substantially synchronous manner with respect to the leading DUT while reducing or eliminating the influence of manufacturing variations and varying operating conditions in the second DUT.

Figure 4:
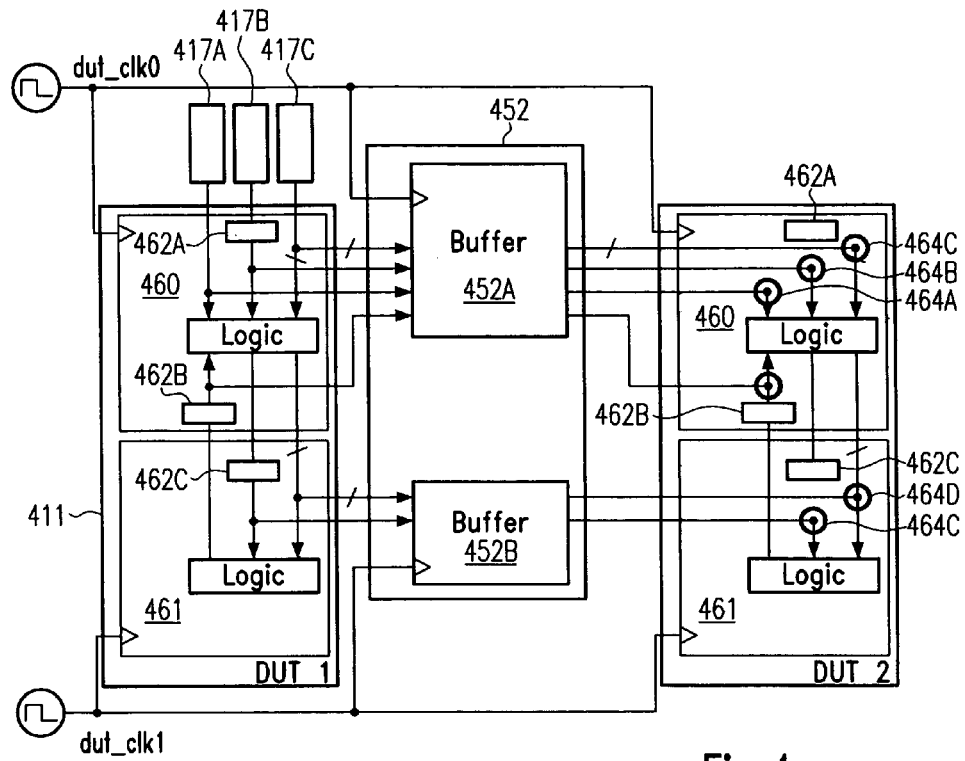
FIG. 4 schematically shows a block diagram depicting an apparatus including hardware representations of a digital circuit design including two or more asynchronous clock domains, wherein clock domain crossing signals are temporarily stored and supplied to a second DUT in a time-delayed manner.

FIG. 4 schematically represents a block diagram illustrating an apparatus 410 for analyzing a specified digital circuit design including a first clock domain operated at a clock signal 416a, also indicated as DUTclk0, and a second clock domain operated at a clock signal 416b, also denoted as DUTclk1. It should be understood from the above discussion that the present invention is, however, not restricted to two different clock domains, but may be applied to any number of clock domains, depending on the hardware resources of the apparatus 410. Hence, the apparatus 410 comprises a first DUT 411 including a hardware representation of the specified digital circuit design and thus including a first hardware representation portion 460 representing the first clock domain, also indicated as DUT-CLK0 domain, wherein, in the following description, the hardware representation portion 460 is also referred to as the first clock domain for convenience. Similarly, a second hardware representation portion 461 representing the second clock domain is provided and is indicated as DUT-CLK1 domain. The first DUT 411 may further comprise a plurality of synchronization logics as are provided in the specified digital circuit design. In the embodiment shown in FIG. 4, synchronization logics 462a . . . 462c are provided, wherein the synchronization logic 462a is provided at an input of the first DUT 411 to synchronize an asynchronous input signal 417b. Moreover, a synchronized input signal 417a may be directly entered into the first clock domain 460 and a further asynchronous input signal 417c may also be directly input into the first clock domain 460. Valid values on signal 417c or 463 are indicated by the synchronized control signals 417b or 462c respectively. The synchronization logic 462b may be provided to synchronize domain-crossing signals coming from the second clock domain 461 and passing to the first clock domain 460. Similarly, the synchronization logic 462c is provided so as to synchronize any control signals arriving from the first clock domain 460 with respect to the target domain, that is the second clock domain 461. As shown, the input signals 417a . . . 417c are also supplied to a buffer 452 as well as any control signals exchanged between the first and second clock domains 460, 461, wherein the sampling of the signals takes place after passing the respective synchronization logic 462a . . . 462c. Synchronous input signal 417a, synchronized input signal 417b, synchronized clock-domain crossing signal 462b and non-synchronized input signal 417c are sampled and stored with DUT-clk0 in a portion 452a of the buffer 452. In the same way, synchronized clock-domain crossing signal 462c and non-synchronized clock-domain crossing signal 463 are sampled and stored with DUT-clk1 in a portion 452b of the buffer 452. If there are both edges used of any clock, sampling and storing may be performed with the doubled frequency of the original clock. For convenience, any means for generating the clock signals are not shown.

The apparatus 410 further comprises corresponding hardware representation portions, i.e., clock domains 460 and 461, in the second DUT 412, wherein the second DUT 412 is additionally configured so as to directly receive all of the delayed signals output by the buffer 452 without the usage of the corresponding synchronization logics 462a . . . 462c. To this end, respective interfaces 464a . . . 464d are provided within the second DUT 412, which are connected to the buffer 452. For instance, the interface 464a allows the introduction of the delayed synchronized input signal 417b into the first clock domain 460 of the second DUT 412. Similarly, the interface 462b supplies the delayed control signals obtained after the synchronization logic 462b of the first DUT 411 to the first clock domain 460 of the second DUT 412. The interface 464c provides the control signals obtained after the synchronization logic 462b of the first DUT 411, while the interface 464d supplies the delayed data signals 463 to the second clock domain 461 of the second DUT 412. In this way, the first and second clock domains 460, 461 of the second DUT 412 are completely decoupled from each other as they obtain their input signals directly from the buffer 452. Consequently, a time-delayed operation of the second DUT 412 with respect to the first DUT 411 is achieved, wherein the amount of delay is determined by the capacitance of the buffer portions 452a, 452b and the corresponding clock frequencies.

During operation of the apparatus 410, a specified state of the first DUT 411 may be detected by a corresponding state monitor (not shown), and the operation of the buffer 452 and of the second DUT 412 may be discontinued in a similar way, as is described with reference to FIGS. 1a-3. Thereafter, a simulation may be performed on the basis of the state readout from the second DUT 412 and on the basis of the history of the input signals 417a . . . 417c and the history of the clock domain crossing signals, which represent the contents of the buffer 452. Regarding any hardware requirements (such as state monitors, interfaces, and the like) for monitoring the state of the first DUT 411 and for transferring a corresponding delayed state of the second DUT 412 and the buffer contents to a corresponding simulator, the same criteria apply in this case as previously pointed out with respect to the embodiments illustrated in FIGS. 1a-3. Moreover, the individual clock domains 460, 461 may be simulated separately, and may therefore reduce the amount of resources required at the simulator side.

In some applications, the storage of domain crossing signals, such as the data signals 463 in FIG. 4, may be deemed inappropriate with respect to the required storage capacitance of the buffer 452. In this case, only the domain crossing control signals may be stored in the buffer rather than control signals and data signals, while a sufficiently accurate synchronization of the first DUT and the second DUT is achieved by appropriately relating the clock signals for the first DUT and the clock signals of the second DUT to a reference clock signal with which the buffer is operated and the sampling of the clock domain crossing signals is performed. The reference clock signal may have a frequency of at least twice the value of the fastest design clock signal, or may even have a significantly higher frequency, depending on the capabilities of the hardware with which the first and second DUTs are formed.

Figure 5:
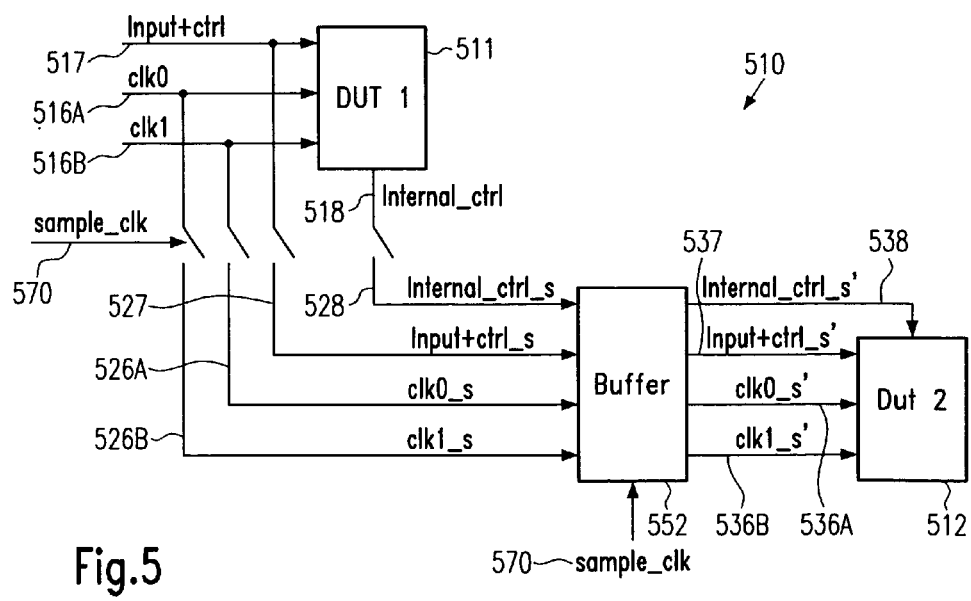
FIG. 5 schematically represents an apparatus for operating two hardware representations including two or more asynchronous clock domains in a substantially time-shifted manner, wherein the synchronism between the time-shifted hardware representations is obtained by introducing a reference clock signal to which the clock signals of the individual clock domains are correlated.

FIG. 5 schematically shows a block diagram for illustrating the concept of synchronizing a first DUT and a second DUT without storing any data signals exchanged between two or more different clock domains. An apparatus 510 for analyzing a specified digital circuit design including two or more different clock domains comprises a first DUT 511 and a second DUT 512, each of which may comprise a corresponding number of hardware representation portions for the various clock domains included in the circuit design. For convenience, neither any hardware representation portions of these various clock domains are shown, nor are any further hardware components required for operating the apparatus 510 depicted. For instance, the first and second DUTs 511 and 512 may have a similar configuration as is described with reference to FIG. 4, however, contrary to FIG. 4, in the second DUT 512, a direct connection between clock domain crossing data signals for at least some of a plurality of data signals may be provided. The apparatus 510 further comprises a buffer 552 configured to be operated with a reference clock signal 570 that has a frequency of at least two times the fastest one of a clock signal 561a and 561b, which are indicated in the drawings as CLK0 and CLK1. Since digital circuitry for obtaining a specified multiple of a given frequency is well-known in the art, a corresponding description is omitted here.

During operation of the apparatus 510, the first DUT 511 may receive input signals 517, also denoted as input+ctrl, which may include any asynchronous signals to be synchronized and which are to represent any clock domain crossing control signals. The input signals 517, synchronized clock domain crossing signals 518 of the DUT 511, denoted as internal_ctrl, and the clock signals 516a, 516b are additionally sampled with the reference signal 570 and are input into the buffer 552 as sampled input signals 527, synchronized clock domain crossing signals 528 of the DUT 511, and sampled clock signals 526a, 526b, also indicated as input+ctrl_s, internal_ctrl_s, CLK0-S, CLK1-S. These signals are then read out from the buffer 552 in a time-delayed manner as time-shifted signals 537, 538, 536a, 536b, which are also indicated as input+CTRL_S', internal_ctrl_s'CLK0-S' and CLK1-S'. Consequently, the clock domains of the second DUT 512 are operated with the time-shifted clock signals 536a, 536b and the time-shifted input and control signals 537, which are highly correlated to the corresponding signals of the first DUT 511, thereby also ensuring a high degree of synchronism of the time-shifted DUT 512 with respect to the leading DUT 511. Depending on the number of data signals crossing between individual clock domains and depending on the specified digital circuit design, the frequency of the reference clock signal 570 may be correspondingly selected moderately high while still achieving a significant reduction of required storage capacity of buffer 552. An increased frequency of the reference clock signal 570 may allow one to substantially avoid timing errors obtained by sampling the signals 517, 516a and 516b. Additionally, or alternatively, an additional clock adjustment/correction logic may be provided. In other embodiments, the first DUT 511 may also be operated by sampled clock signals, for example the signals 526a and 526b. As may readily be appreciated, various other sampling error corrections may be performed so as to obtain a substantially synchronous operation of the first and second DUTs 511, 512. Regarding the further process of analyzing the behavior of the specified digital circuit design, substantially the same criteria as previously explained with reference to FIGS. 1a-4 also apply in this case.

As a result, the present invention provides an improved technique that enables efficient analysis of a specified digital circuit design, wherein a combination of at least two hardware representations and a simulation and/or a step-by-step operation of the delayed hardware representation provides 100% design visibility and full debugging support, while nevertheless tremendously reducing the required simulation time, since the simulation start point is reached by running the test system in real time or approximately in real time, thereby drastically shortening the period for which a simulation is required. Moreover, data traced in a second hardware representation are used as stimuli in the short simulation process and hence the analysis and verification is achieved with authentic data providing the potential for accomplishing an efficient hardware-software co-design. Even complex circuit designs including embedded RAM memories and asynchronous multi-clock domains may be effectively analyzed by the technique of operating two or more hardware representations in a time-shifted manner.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    operating a second hardware representation of a digital circuit design in a time-delayed manner with respect to a first hardware representation of said digital circuit design, wherein said digital circuit design comprises a first design portion to be operated with a first design clock signal and a second design portion to be operated with a second design clock signal other than said first design clock signal;
    upon occurrence of a predetermined abort state in said first hardware representation, analyzing an operational behavior of said digital circuit design on the basis of a state of said second hardware representation by simulating an operation of said digital circuit design on the basis of said delayed state of said second hardware representation using a simulation model of said digital circuit design; and
    generating a reference clock signal having a frequency that is at least twice the frequency of a higher one of the first and second design clock signals, which is used to correlate the time-shifted operation, and correlating said time-shifted operation of said first and second hardware representations with said reference clock signal.

2. The method of claim 1, wherein said first hardware representation is operated with a specified set of input signals and said specified set of input signals is supplied to said second hardware representation of said specified digital circuit design in a time-delayed manner so as to operate said second hardware representation time-delayed with respect to said first hardware representation.

3. The method of claim 2, further comprising:
    interrupting the operation of said first and second hardware representations upon occurrence of said abort state of said first hardware representation; and
    determining the delayed state of said second hardware representation after interrupting the operation to analyze said digital circuit design.

4. The method of claim 2, wherein said specified set of input signals is temporarily stored in a buffer prior to being supplied to said second hardware representation.

5. The method of claim 4, wherein said specified set of input signals is entered into said buffer and is read out from said buffer after a predefined number of clock signal periods of a reference clock signal that is correlated with a clock signal used for operating at least one of said first and second hardware representations.

6. The method of claim 5, wherein said reference clock signal is the same as a clock signal used for operating said first and second hardware representations.

7. The method of claim 1, further comprising verifying said simulation model by comparing a simulated state of said digital circuit design with said abort state.

8. The method of claim 1, wherein said second hardware representation is operated in a step-wise manner after occurrence of said abort state, whereby the state of said second hardware representation is read out after each step.

9. The method of claim 1, further comprising temporarily storing signals of said first hardware representation that are exchanged between a first hardware representation portion representing said first design portion and a second hardware representation portion representing said second design portion in said first hardware representation.

10. The method of claim 9, further comprising supplying said temporarily stored signals to a first hardware representation portion and a second hardware representation portion, respectively, of said second hardware representation so as to decouple the first and second hardware representation portions of said second hardware representation from each other.

11. The method of claim 10, further comprising analyzing the digital circuit design by separately simulating the operation of said first and second hardware representation portions of said second hardware representation by simulating operation of said first and second hardware representation portions using at least one simulation model of said digital circuit design.

12. An apparatus for analyzing a digital circuit design, wherein said digital circuit design comprises a first design portion to be operated with a first design clock signal and a second design portion to be operated with a second design clock signal other than said first design clock signal, the apparatus comprising:
   a first hardware representation of said digital circuit design;
   a second hardware representation of said digital circuit design;
   a generator for generating a reference clock signal having a frequency that is at least twice the frequency of a higher one of the first and second design clock signals, which is used to correlate time-shifted operation of said first and second hardware representations with said reference clock signal;
   a software simulator of said circuit design;
   an interface linked to said second hardware representation and configured to receive a status data of said second hardware representation; and
   a state monitor configured to identify a specified state of said first hardware representation and initiate simulation of said circuit design using the software simulator upon occurrence of a predetermined abort state in said first hardware representation.

13. The apparatus of claim 12, further comprising a buffer linked to said interface to receive said status data of said second hardware representation.

14. The apparatus of claim 12, further comprising an input section configured to supply a set of input signals to said first hardware representation and to supply said set of input signals to said second hardware representation in a time-delayed manner.

15. The apparatus of claim 14, wherein said input section is configured to receive output signals from said first hardware representation.

16. The apparatus of claim 15, wherein said input section includes a test environment of said circuit design.

17. The apparatus of claim 14, wherein said input section comprises a buffer configured to temporarily store said predefined set of input signals prior to supplying the same to said second hardware representation.

* * * * *